United States Patent

Bernstein et al.

[11] Patent Number: 5,903,009
[45] Date of Patent: May 11, 1999

[54] BIASED AND SERRATED EXTENSION TUBE FOR ION IMPLANTER ELECTRON SHOWER

[75] Inventors: James D. Bernstein, Beverly; Brian S. Freer, Medford; Peter L. Kellerman, Essex, all of Mass.

[73] Assignee: Eaton Corporation, Cleveland, Ohio

[21] Appl. No.: 08/929,180

[22] Filed: Sep. 8, 1997

[51] Int. Cl.$^6$ .................................................. H01J 37/317
[52] U.S. Cl. ..................................... 250/492.21; 250/251
[58] Field of Search ................................ 250/492.21, 251

[56] References Cited

U.S. PATENT DOCUMENTS 5,399,871  3/1995  Ito et al. ............................ 250/492.21

Primary Examiner—Kiet T. Nguyen
Attorney, Agent, or Firm—John A. Kastelic

[57] ABSTRACT

A plasma-enhanced electron shower (62) for an ion implantation system (10) is provided, including an extension tube (66) having a replaceable graphite inner liner (88). The inner liner is biased to a low negative potential (−6 V) to prevent low energy secondary electrons generated by the electron shower target from being shunted away from the wafer, keeping them available for wafer charge neutralization. The electrically biased inner surface is provided with serrations (126) comprising alternating wafer-facing surfaces (128) and target-facing surfaces (130). During operation of the electron shower (62), photoresist or other material which may sputter back from the wafer collects on the wafer-facing surfaces (128), rendering them non-conductive, while the target-facing surfaces (130) remain clean and therefore conductive. The conductive target-facing surfaces provide a shunt (low resistance) path to electrical ground for high energy electrons generated in the electron shower.

17 Claims, 7 Drawing Sheets

BIASED AND SERRATED EXTENSION TUBE FOR ION IMPLANTER ELECTRON SHOWER

FIELD OF THE INVENTION

The present invention relates generally to the field of ion implanters, and more specifically to an improved electron shower or flood in an ion implanter.

BACKGROUND OF THE INVENTION

Ion implantation has become the technology preferred by industry to dope semiconductors with impurities in the large scale manufacture of integrated circuits. A typical ion implanter comprises three sections or subsystems: (i) a terminal for outputting an ion beam, (ii) a beamline for directing and conditioning the beam output by the terminal, and (iii) an end station which contains a semiconductor wafer to be implanted by the conditioned ion beam. The terminal includes a source from which a beam of positively charged ions is extracted. The beamline components adjust the energy level and focus of the extracted positively charged ion beam on its way toward the wafer to be implanted.

A problem encountered in the use of such an ion implanter is that of wafer charging. As the positively charged ion beam continues to impact the wafer, the surface of the wafer may accumulate an undesirable excessive positive charge. Resulting electric fields at the wafer surface can damage microcircuitry on the wafer. The problem of accumulated surface charge becomes more pronounced as implanted circuit elements become smaller, because smaller circuit elements are more susceptible to damage caused by the resultant electric fields.

Another problem encountered in the use of such an ion implanter, especially in low energy applications, is a phenomenon referred to as beam "blow-up", which concerns the tendency for like (positively)-charged ions within the beam to mutually repel each other (also known as the space charge effect). Such mutual repulsion causes a beam of otherwise desired shape to diverge away from an intended beamline path. Beam blow-up is particularly problematic in high current, low energy applications because the high density of ions in the beam (high current) exaggerates the force of mutual repulsion of the ions, and the small velocities (low energy) of the ions allows more time for the repulsive force to act upon the ions before they reach the wafer.

A known solution to both wafer charging and the beam blow-up phenomenon is the use of an electron or plasma shower. Such showers may also be referred to as electron or plasma floods. Both electron and plasma showers generate low energy electrons and introduce these electrons into the beam. Plasma floods generate a plasma in an arc chamber and the ion beam potential extracts low energy plasma and electrons into the beam. Electron showers generate secondary (low energy) electrons which are used to enhance the beam to reduce space charge (beam blow-up) tendencies and wafer charging effects.

A typical electron shower shower includes a target chamber in which secondary electrons are generated and an extension tube connected downstream of the target chamber. As the ion beam passes through the target chamber, secondary electrons infiltrate and partially neutralize the beam. The partially neutralized beam passes through the extension tube toward the wafer to be implanted. The trapped low energy electrons thereby neutralize the net charge of the beam which in turn reduces the positive charge accumulation on wafer as the ion beam strikes the wafer surface. The neutralized beam is also less likely to experience detrimental beam blow-up characteristics. Such a system is shown in U.S. Pat. No. 4,804,837 to Farley, assigned to the assignee of the present invention and incorporated by reference as if fully set forth herein.

The extension tube of a typical electron shower is made of graphite which provides a conductive path to ground for high energy primary electrons which are preferably prevented from reaching the surface of the wafer. High energy primary electrons could otherwise negatively charge and damage the surface of the wafer. Low energy secondary electrons are preferably passed through the extension tube along with the ion beam to beneficially neutralize positive wafer charging, without negatively charging the wafer.

When the graphite extension tube is new, however, it provides a highly conductive shunt path to ground. As such, even secondary low energy electrons are shunted to ground, removing these shunted electrons from the available supply of charge neutralizing secondary electrons. Over the course of operation of the electron shower, the ion beam passing therethrough impacts the wafer to be implanted, causing a sputtering effect of surface material such as photoresist or silicon or silicon dioxide. The photoresist or other material is back-sputtered to the interior surface of the extension tube, which is the closest portion of the electron shower to the wafer.

Soon after a thin layer of photoresist or other material is back-sputtered to the extension tube, optimal operation results. Because the tube has become slightly less conductive, the tube will charge negatively from the impinging electrons and create a potential barrier preventing low energy electrons from being shunted to ground. Thus, low energy secondary electrons are passed through the tube along with the ion beam to serve their charge neutralizing function. Primary high energy electrons, however, continue to be shunted to ground. Thus, an extension tube must be in use for a "break-in" time before it operates as intended.

As operation continues, however, effectiveness of the extension tube deteriorates. As back-sputtering of photoresist or other material continues, the extension tube becomes increasingly electrically insulating. If the tube becomes sufficiently insulating, even high energy primary electrons will be undesirably passed on to the wafer. In addition, high energy primary electrons which strike the inner insulating surface of the extension tube charge this surface. Secondary electrons which may originate on the surface of the tube, rather than the chamber, therefore assume energy levels consistent with the potential of the insulating surface. The energy level and current density of the secondary electrons therefore drifts higher and higher as the photoresist or other material coating continues to thicken over time, creating more undesirable high energy secondary electrons.

The effectiveness of a particular electron shower depends in part on the efficient generation of a sufficient supply of secondary electrons having consistently low and predictable energy levels. Accordingly, it is an object of the present invention to provide an electron or plasma shower extension tube which increases the number of secondary electrons which are available for charge neutralization purposes, while insuring that secondary electron energy levels are minimal and constant, by providing better control over the energy levels of secondary electrons passed therethrough.

It is a further object of the present invention to provide an electron or plasma shower extension tube which prevents high energy primary electrons from reaching the surface of the wafer.

It is yet a further object of the present invention to provide an electron or plasma shower extension tube which minimizes the adverse effects of back-sputtered contamination.

SUMMARY OF THE INVENTION

A plasma-enhanced electron shower for an ion implantation system is provided, including an extension tube having a replaceable graphite inner liner. The inner liner is biased to a low negative potential of up to −10 V (approximately −6 V) to prevent low energy secondary electrons generated in the electron shower target chamber from being shunted away from the wafer, keeping them available for wafer charge neutralization. The electrically biased inner surface is provided with serrations comprising alternating wafer-facing surfaces and target-facing surfaces. During operation of the electron shower, photoresist or other material which may sputter back from the wafer collects on the wafer-facing surfaces, rendering them non-conductive, while the target-facing surfaces remain clean and therefore conductive. The conductive target-facing surfaces provide a shunt (low resistance) path to ground potential for high energy electrons generated in the electron shower.

DETAILED DESCRIPTION OF A PREFERRED EMBODIMENT

Figure 1:
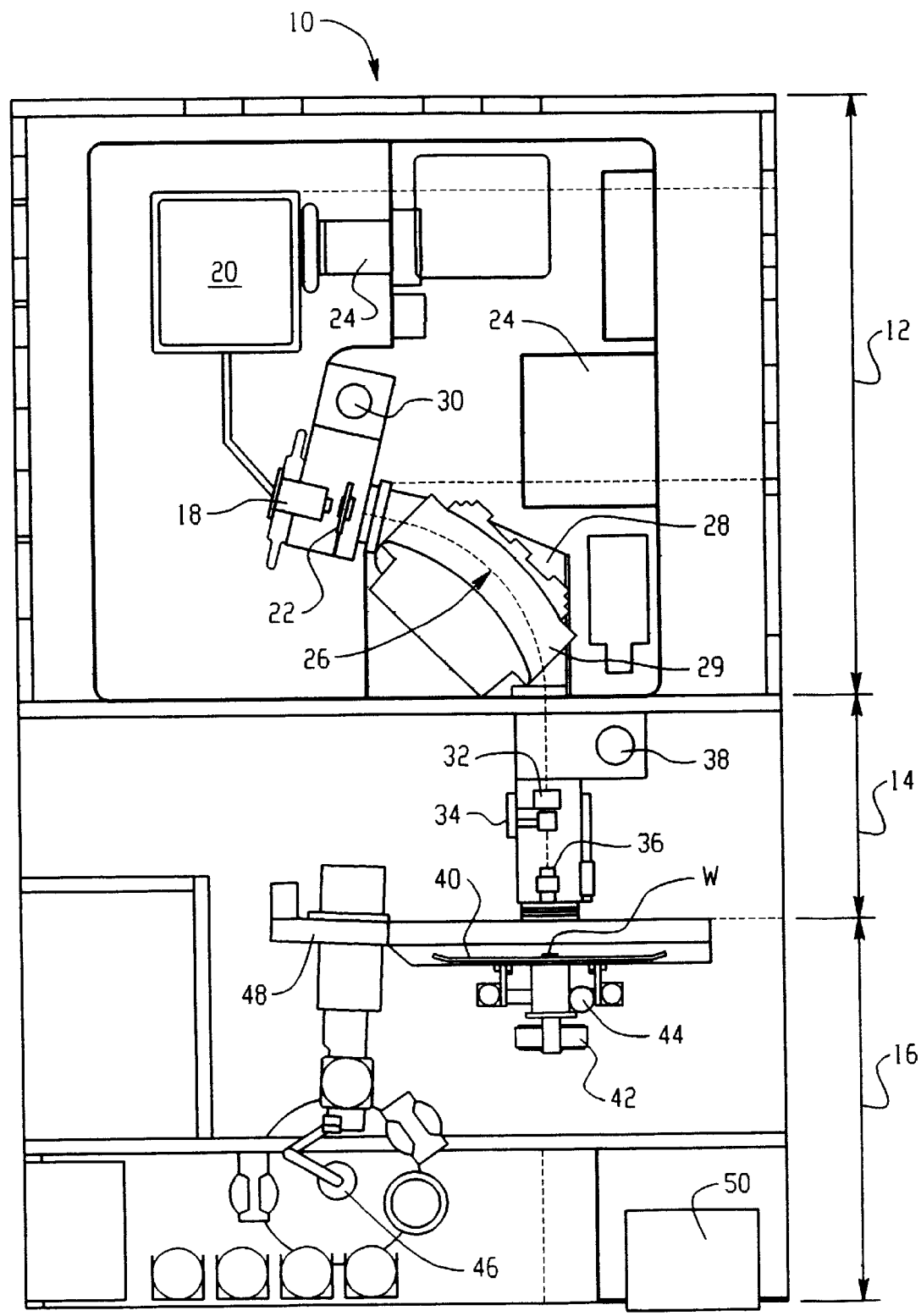
FIG. 1 is a plan view of an ion implantation system incorporating one embodiment of an electron shower constructed according to the principles of the present invention.

Referring now to the drawings, FIG. 1 discloses an ion implanter, generally designated 10, which comprises a terminal 12, a beamline assembly 14 and an end station 16. Generally, the terminal 12 outputs an ion beam, and the beamline assembly 14 adjusts the focus and energy level of the ion beam and directs it toward a wafer W positioned at the end station 16.

The terminal 12 includes an ion source 18 having a chamber in which dopant gas from a gas box 20 is injected. Energy is imparted to the ionizable dopant gas to generate positive ions within the source chamber. An extraction electrode 22 powered by high voltage supply 24 extracts a beam 26 of positive ions from the source chamber and accelerates the extracted ions toward a mass analysis magnet 28. The mass analysis magnet 28 functions to pass only ions of an appropriate charge-to-mass ratio on to the beamline assembly 14. Evacuation of the beam path 29 provided by the mass analysis magnet 28 is provided by vacuum pump 30.

The beamline assembly 14 comprises a quadrature lens 32, a flag Faraday 34, an electron shower 36, and, optionally, an ion beam acceleration/deceleration electrode (not shown in FIG. 1). The quadrature lens 32 focuses the ion beam output by the terminal 12 and the flag Faraday 34 measures ion beam characteristics during system set-up. The electron shower 36 which comprises the present invention is further explained below. The acceleration/deceleration electrode is used to accelerate or decelerate the focused ion beam to a desired energy level prior to implantation into a wafer at the end station 16. Evacuation of the beam path provided by the beamline assembly 14 is provided by vacuum pump 38.

The end station 16 includes a disk 40 upon which a plurality of wafers are mounted, a rotary drive mechanism 42 for imparting rotational motion to the disk, and a linear drive mechanism 44 for imparting linear motion to the disk. A robotic arm 46 loads wafers onto the disk via a load lock chamber 48. Operation of the system is controlled by an operator control station 50 located at the end of the end station 16.

Figure 2:
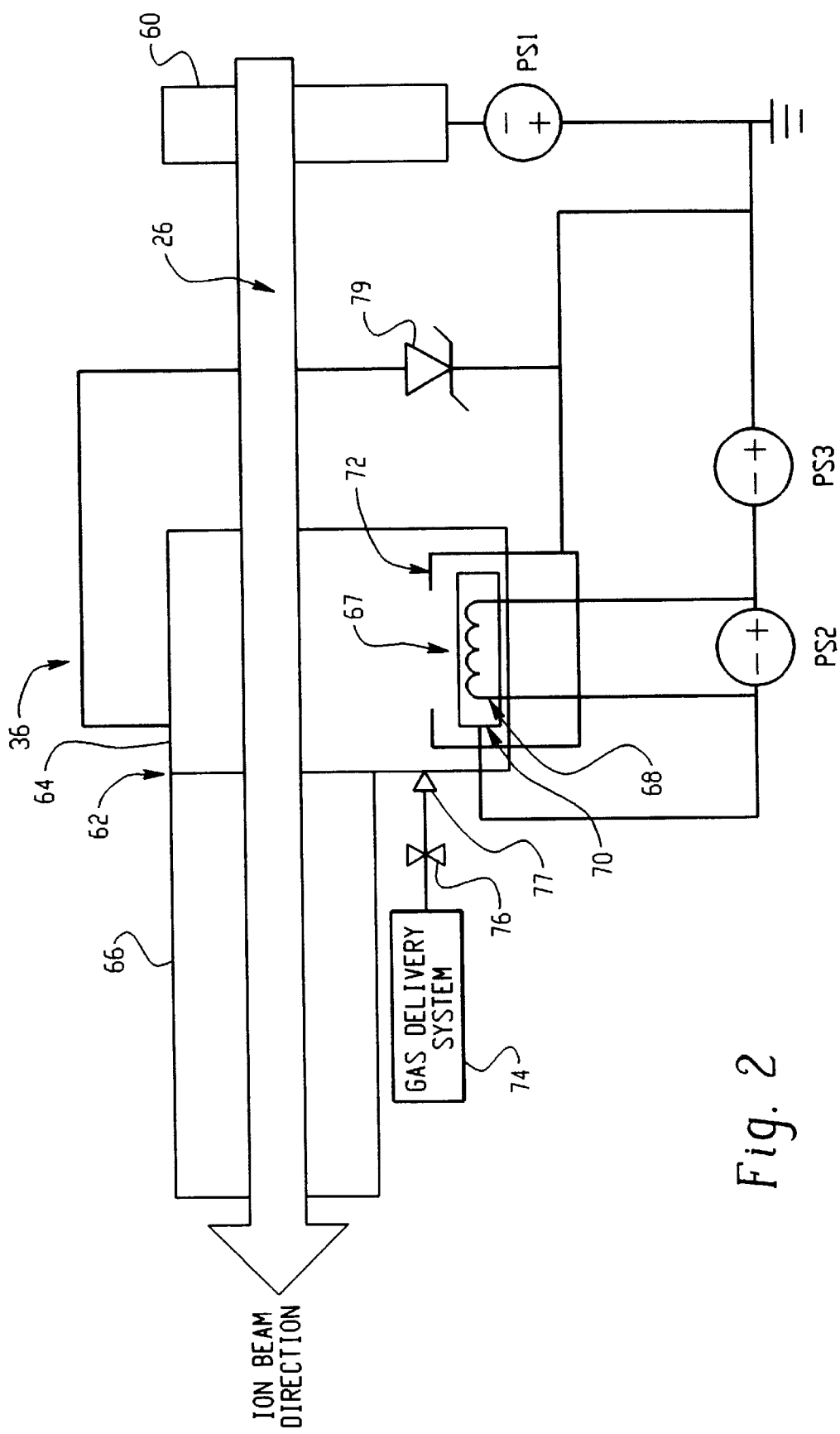
FIG. 2 is an electrical schematic view of the electron shower of the ion implantation system of FIG. 1.
Figure 3:
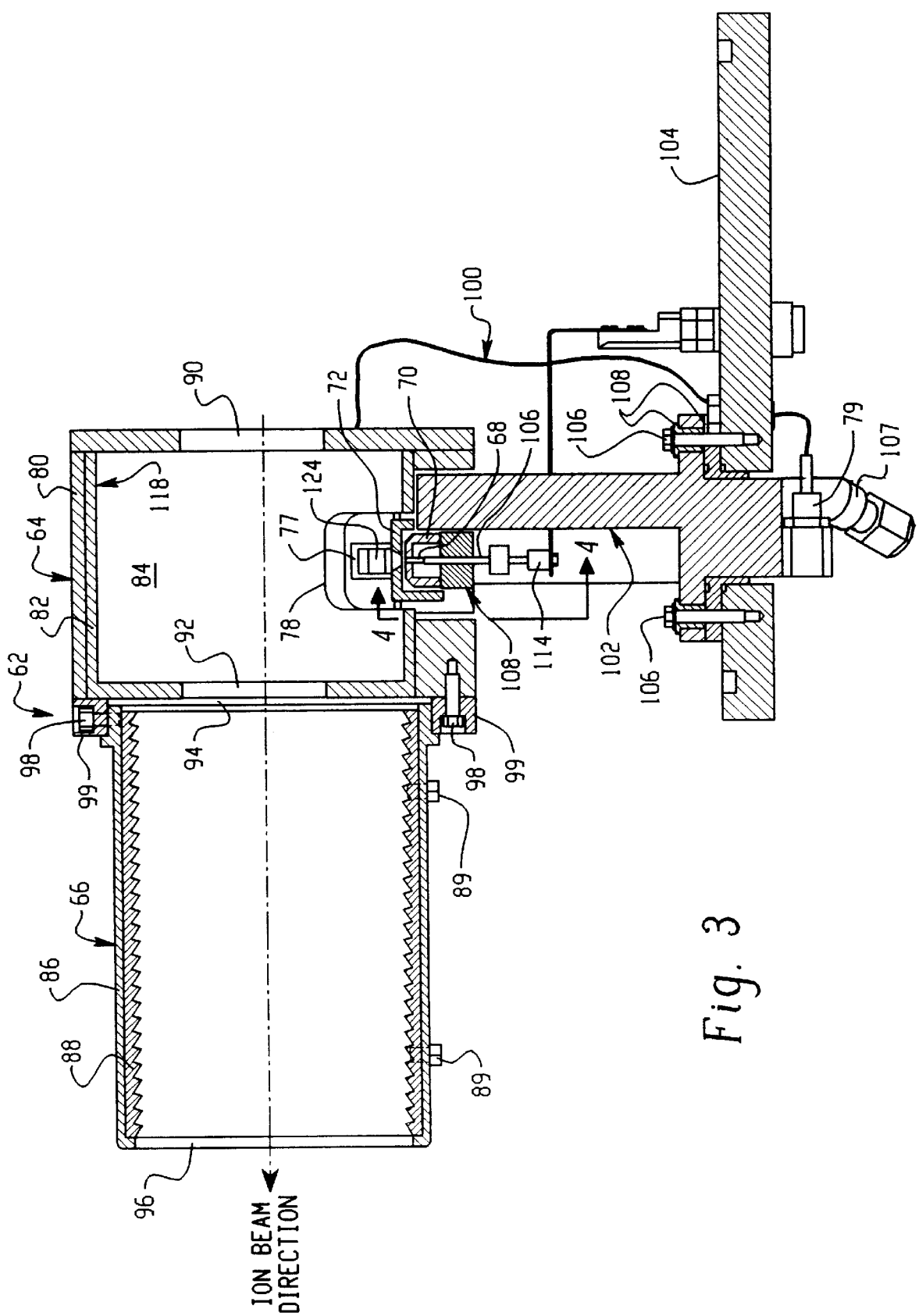
FIG. 3 is a sectional view of the target/tube assembly of the electron shower of FIG. 2.

The electron shower 36 is shown in more detail in FIGS. 2–9. FIG. 2 is a schematic of the electron shower 36 which comprises a biased magnetic electron reflector 60 and a target/tube assembly 62. The target/tube assembly 62 comprises a target 64 and an extension tube 66, both of which, in the preferred embodiment, are cylindrical in shape. The target 64 includes a filament subassembly 67 comprising a filament 68 for thermionically emitting primary electrons, a filament electrode 70 for directing the trajectory of the emitted primary electrons, and an extraction aperture 72. A gas delivery system 74 injects a supply of inert gas such as argon or xenon into the interior of the target subassembly 64 by means of valve 76 and gas injection nozzle 77. The gas injection nozzle 77 and the filament subassembly 67 are attached to the target 64 at the location of a cutout 78 (FIG. 3).

The magnetic electron reflector 60 is set to an electrical voltage potential of approximately −2500 volts (V) by a power supply PS1. The biased reflector 60 prevents high current ion beams from attracting electrons, thereby preventing beam blow-up. The position of the biased reflector away and separate (upstream) from the target/tube assembly 64 ensures that its electric field does not adversely influence primary electron trajectories by urging primary electrons into the extension tube 66 toward the wafer. At low beam energies, the bias may be eliminated (turned off) to prevent electrons from being stripped from the beam.

A power supply PS2 of approximately −12 V (with respect to the filament electrode 70) supplies the filament 68, and a power supply PS3 of approximately −300 V supplies the filament electrode 70. Thus, the filament is at approximately −312 V with respect to ground potential. The extraction aperture 72 is electrically grounded, and a −6 V bias voltage is applied to the target 64 by bias (zener) diode 79. The purposes of these voltage potential differences, the magnitudes of which are made merely for example, is explained further below with respect to FIG. 3.

FIG. 3 shows a sectional view of the target/tube assembly 62 of FIG. 2. The target 64 of the target/tube assembly 62 includes an outer aluminum housing 80 and in inner liner 82 formed of a non-oxidizable (incapable of forming an insulating oxide) material such as graphite and defining a plasma/secondary electron target chamber 84. The extension tube 66 of the target/tube assembly also includes an outer aluminum housing 86 and an inner graphite liner 88 attached to the outer housing 86 by means of fasteners such as screws 89. The ion beam passes through both the target 64 (arriving through entrance aperture 90 and leaving through exit aperture 92) and the extension tube 66 (arriving through entrance aperture 94 and leaving through exit aperture 96) on its way toward the wafer W to be implanted. The target 64 and extension tube 66 are fixedly connected by fasteners such as bolts 98 and collars 99. Diode 79 (see FIG. 2) applies a bias voltage of −6 V to the inner graphite liners 82 and 88 of the target and extension tube, respectively, by means of connecting wire 100.

The target/tube assembly 62 is attached to a water cooled support 102 which is connected to a mounting plate 104 by means of bolts 106. Water inlet 107 permits intake of cooling water to the support 102 (water outlet not shown). Insulators 108 electrically isolate the target tube assembly (−6 V) from the mounting plate (electrically grounded). The mounting plate 104 provides means to install the target/tube assembly into the ion implantation system of FIG. 1.

Attached to the target 64 are both the gas injection nozzle 77 and the filament subassembly 67. The filament subassembly 67 generates primary high energy electrons which, upon impact with the inner graphite liner 82 of the target 64, causes emission of secondary lower energy electrons. The high energy electrons also indirectly enhance the secondary electron emission rate by ionizing gas which is injected into the chamber 84 by gas injection nozzle 77. Ionization of the gas molecules creates a plasma which increases the secondary electron emission rate of the inner graphite liner 82.

Figure 4:
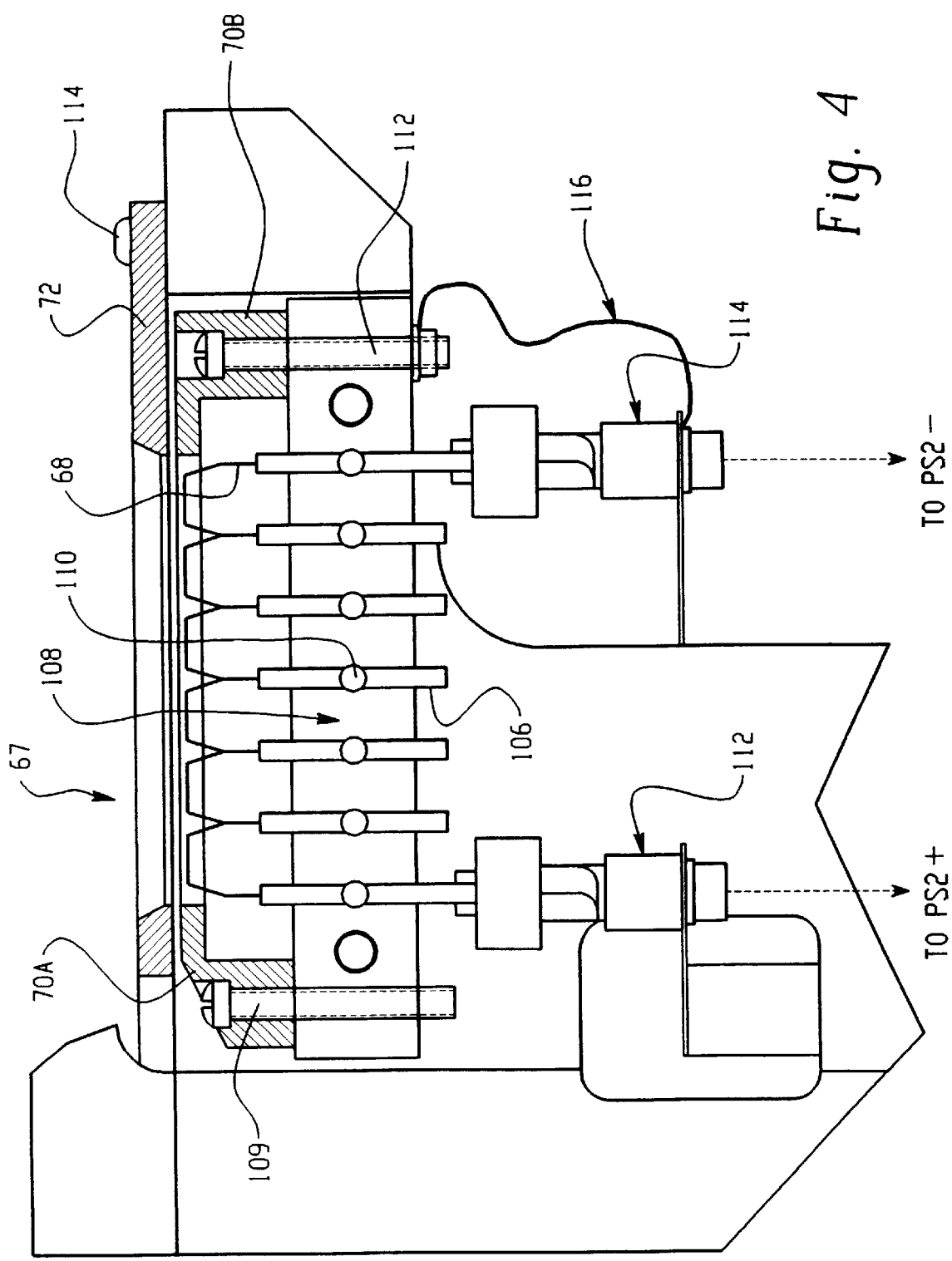
FIG. 4 is a partial sectional view of the filament subassembly of the target/tube assembly of FIG. 3, taken along the line 4—4.
Figure 5:
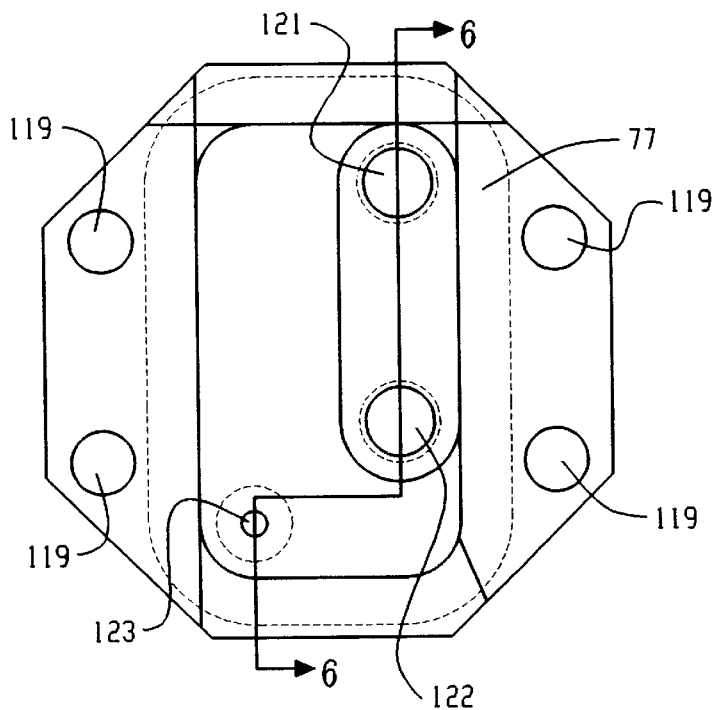
FIG. 5 is a plan view of the gas injection nozzle of the electron shower of FIG. 2.
Figure 6:
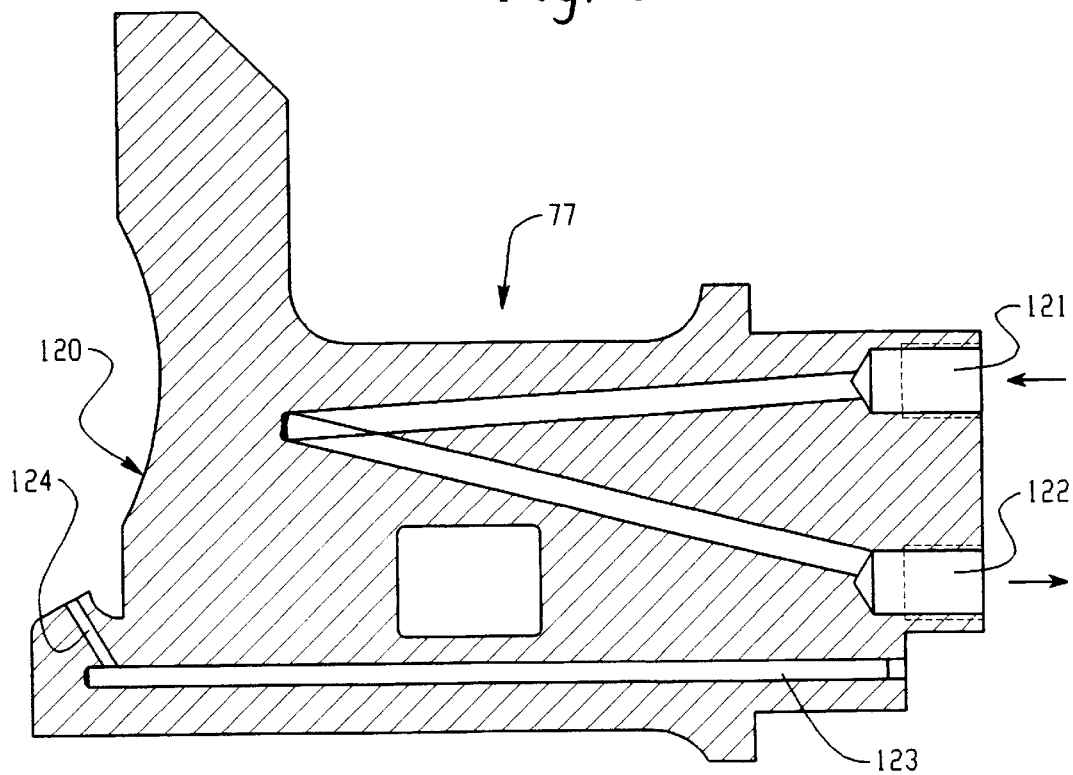
FIG. 6 is a partial sectional view of the gas injection nozzle of FIG. 5, taken along the line 6—6.

The filament assembly 67 is shown in greater detail in FIG. 4. The filament 68 is comprised of a plurality of tungsten segments connected end-to-end and supported by tantalum legs 106 which are fixedly attached to an electrically insulating block 108 by fasteners 110. The filament electrode 70 is attached to the insulating block 108 by fasteners 112, and the extraction aperture 72 is attached to the insulating block by fasteners 114. Power is provided from PS2 (FIG. 2) to the filament 68 through connectors 112 and 114. The negative terminal of PS2 (connector 114) is also connected to the filament electrode 70 by means of conductor 116 and fastener 112. Extraction aperture 72, which is constructed from graphite, remains at electrical ground potential.

The filament 68 emits primary electrons, by means of thermionic emission, which are drawn into the chamber 84 (FIG. 3) by grounded aperture 72. These high energy electrons impact an inner surface 118 of the inner graphite liner 82 of the target 64. Upon impact, the surface 118 of the graphite liner emits secondary electrons having energies much less than the impacting primary electrons. For example, the primary electrons assume energies of up to 312 electron-Volts (eV) when passing through the electrical field provided by the filament electrode (−312 V), while most of the emitted secondary electrons only possess energies of less than 20 eV. No more than about 6 eV (consistent with the −6 V potential applied to the inner liner 82 of the target 64) is added to the secondary electron level by the liner 82. With an ion beam potential of approximately 10–12 V, the secondary electrons have an energy level sufficiently low to be trapped into the beam and transported therewith toward the wafer to be implanted.

The filament assembly 67 of FIG. 4 provides a focusing mechanism for directing the primary electrons thermionically emitted by the filament 68. The end-to-end length of the filament (2–3 inches) provides sufficient surface area to create an adequate supply of primary electrons. The negatively biased filament electrode 70 comprises portions 70A and 70B which surround the filament 68 and ensure that the filament only experience an electric field in the direction of the extraction aperture 72. Thus, the filament electrode 70 tends to focus the primary electrons toward the center of the electrode so that they are drawn into the chamber 84 through the center of the grounded extraction aperture 72. Accordingly, the primary electrons are focused directly at the inner surface 118 of the graphite liner 82 of the chamber 84, and not downstream toward the wafer (through chamber exit aperture 92) or upstream toward the terminal 12 (through chamber entrance aperture 90). Thus, more primary electrons are directed to the graphite inner surface 118, improving the efficiency of secondary electron generation, and minimizing the adverse effects of primary electrons drifting upstream or downstream of the chamber 84.

In addition to improving the efficiency of secondary electron generation, the present invention also provides for more uniformity in the energy levels of the generated secondary electrons. The use of graphite as a replaceable inner liner of the chamber 84 prevents oxidation of the inner surface 118, which would otherwise occur if the inner surface were constructed from aluminum. As such, the energy level of secondary electrons emitted by the graphite surface 118 as a result of the impacting primary high energy electrons does not drift upward due to uncontrolled formation of an oxide coating on the surface. Instead, the secondary electrons which are emitted from the surface 118 generally assume an energy level consistent with the bias applied to the graphite inner liner, within a secondary electron normal distribution, resulting in better control of the energy levels of the secondary electrons. These low energy electrons become thermalized in the plasma created within chamber 84 and are easily captured by the beam potential. The low energy electrons have a low amplitude of oscillation and spend most of their time within the ion beam core.

Plasma is created in the chamber 84 to increase the secondary electron emission rate by extracting secondary electrons from the surface 118. The plasma is created by an inert gas, such as argon or xenon, which is injected into the chamber 84 via the nozzle 77 of FIGS. 5 and 6 (see also FIGS. 2 and 3), and ionized by impact with the high energy electrons emitted from filament 68. The plasma surrounds the ion beam, creating a sheath between the plasma and the inner surface 118 of the chamber 84 (see FIG. 8).

The nozzle 77 is comprised of aluminum and is attached to the target 64 at the location of cutout 78 (FIG. 3) by means of fasteners installed through holes 119. Curved surface 120 mates with the cylindrical target 64. The nozzle includes a fluid inlet 121 and a fluid outlet 122 through which water may be provided and drained, respectively, to provide a cooling medium during operation thereof. The gas is provided through passageway 123 and injected into the chamber 84 through inlet 124.

Figure 7:
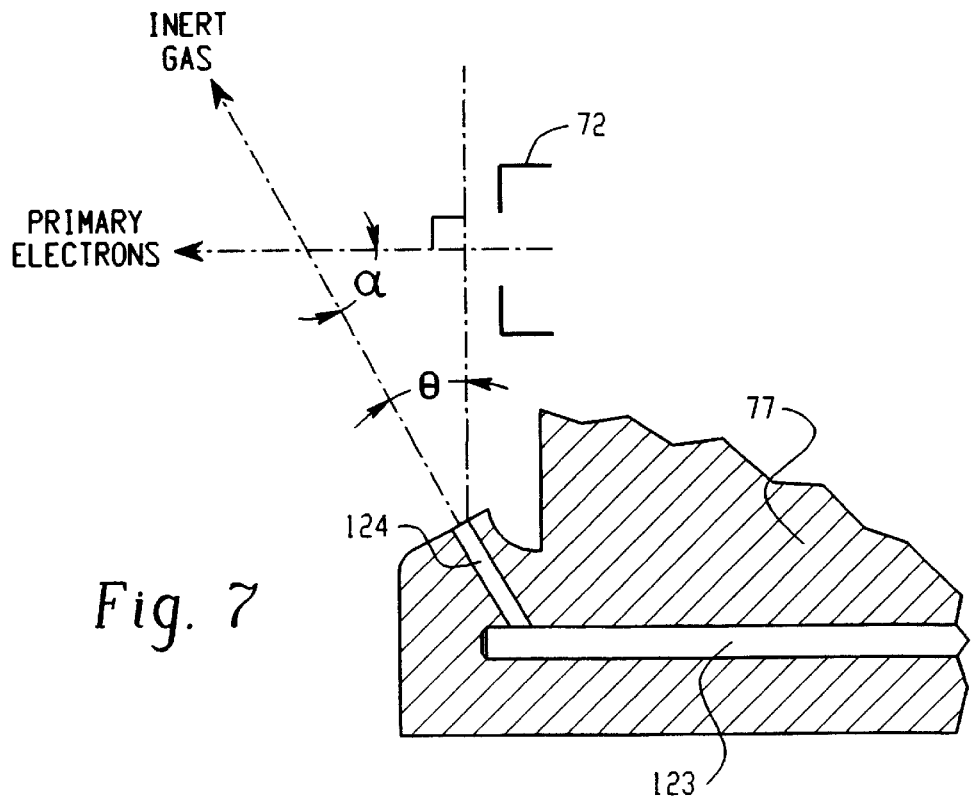
FIG. 7 is a diagram showing the orientation of the outlet of the nozzle of FIG. 6 and the filament subassembly extraction aperture of FIG. 4.
Figure 8:
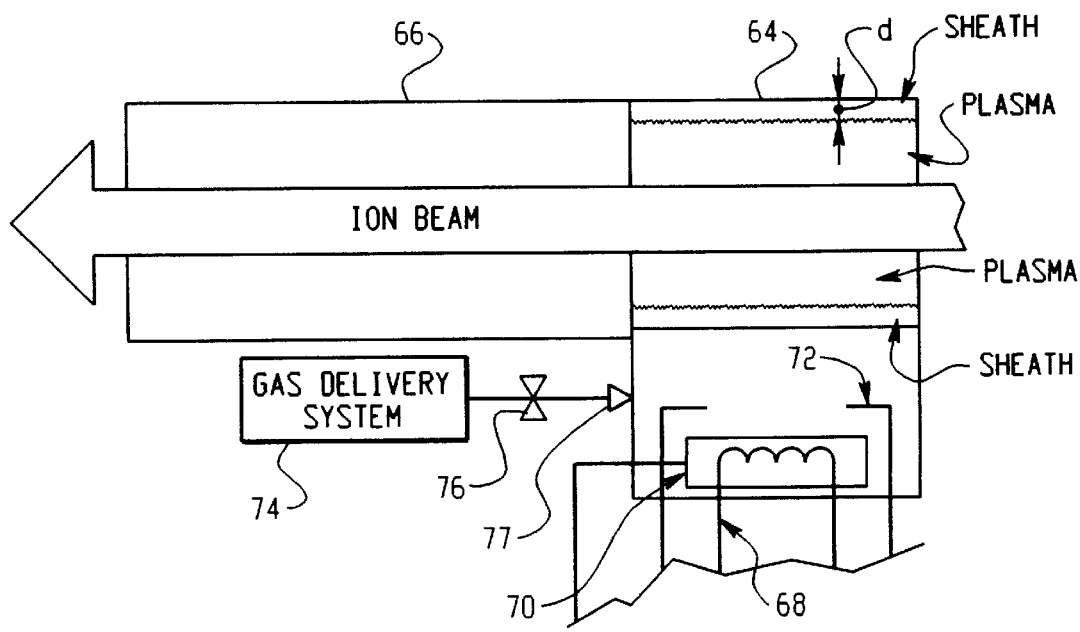
FIG. 8 is partial sectional view of the target/tube assembly of FIG. 3.

The inlet 124 has an aspect (length-to-diameter) ratio of greater than 5:1 (approximately 10:1 in the preferred embodiment) and is directed toward the stream of primary electrons which are emitted from the filament 68. As shown in FIG. 7, the inlet (124) is pointed slightly forward, at an angle θ of approximately 10 and 30 degrees (preferably 15 to 25 degrees), beyond the grounded extraction aperture 72. Accordingly, the streams of primary electrons and gas molecules are emitted in directions which meet at an angle α of about 60 to 80 degrees (preferably 65 to 75 degrees). Such an orientation of the gas inlet (124) with respect to the primary electron extraction aperture (72) insures that the gas molecule stream, which begins to diverge (at approximately 10 degrees) as it exits the inlet 124, maximally intersects the primary electron stream, which is also diverging as it exits aperture 72. Accordingly, the ionization rate of the gas molecules is increased, resulting in an increased plasma density and corresponding increase in secondary electron emission rate.

The secondary emission rate is also enhanced by the cylindrical surface area of inner surface 118 which is significantly larger than would be provided if the surface 118 were located at the radial location of apertures 90 and 92, instead of radially beyond (FIG. 3). Because the radius of the apertures 90 and 92 is substantially less than the radius of the cylindrical chamber 84, the ends of the cylindrical chamber 84 remain partially closed, serving to maintain plasma pressure (and thus density) as well as prevent the plasma from being conducted upstream. Exit aperture 92 also prevents sputtered material from the wafer W and disk 40 from contaminating the interior of the chamber.

The increased volume and density of the plasma within the chamber 84 results in a corresponding decreased distance d between the plasma and the inner surface 118 of the chamber (FIG. 8), because a plasma of higher density requires a smaller sheath to shield a given potential. The secondary electron emission rate increases with decreasing distance d, per the Child-Langmuir law. The secondary electron emission rate also increases with increased plasma density and volume, because increased ionization results in that the primary electrons have a greater chance for collision with a gas molecule.

Figure 9:
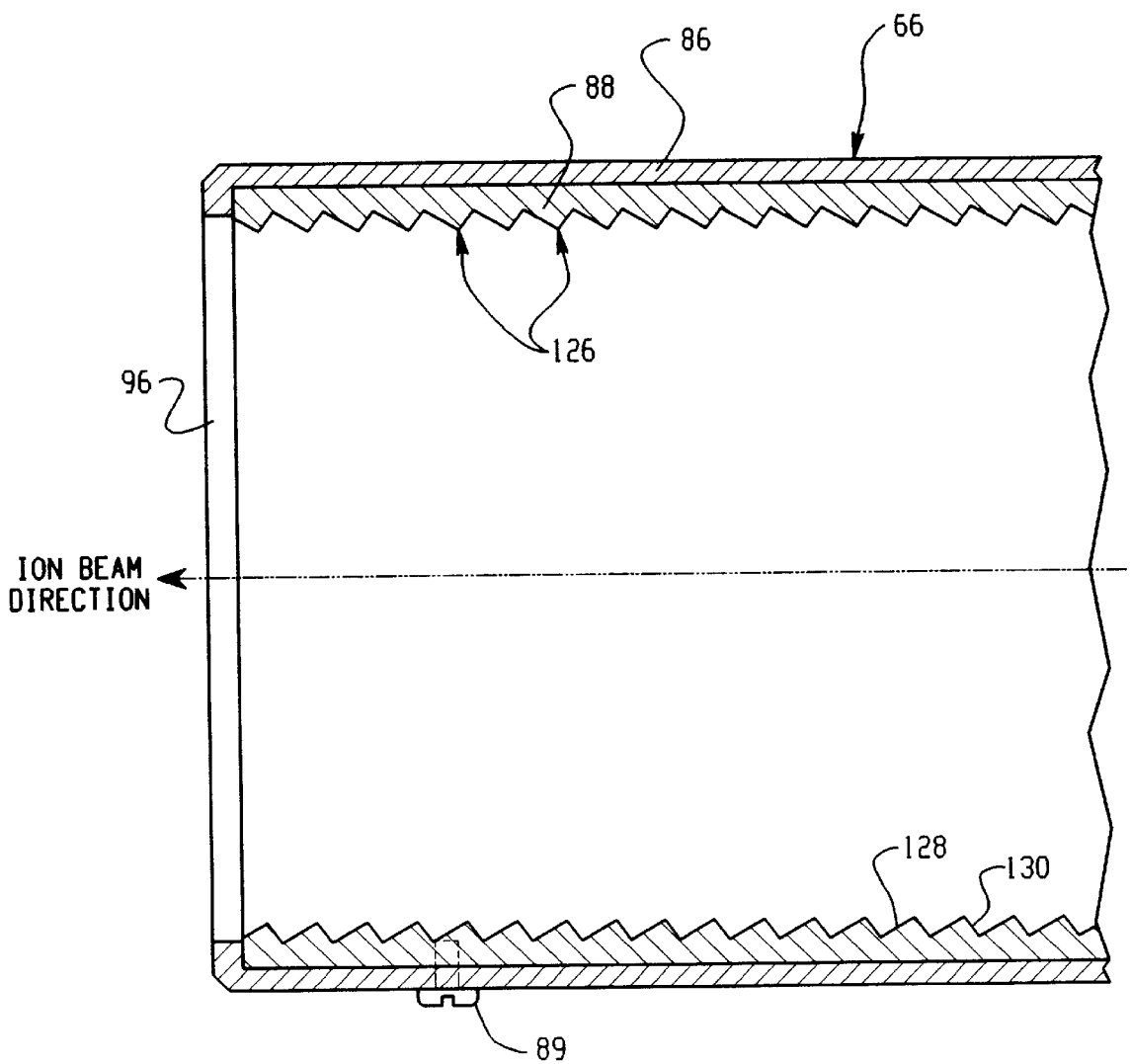
FIG. 9 is a partial sectional view of the extension tube of the target/tube assembly of FIG. 3.

FIG. 9 shows in greater detail the extension tube 66, which is comprised of cylindrical aluminum housing 86 and cylindrical inner liner 88 formed of a non-oxidizable material such as graphite. The extension tube 66 shunts the primary high energy electrons generated within the target 64 and prevents these electrons from reaching the surface of the wafer. In this manner, the extension tube 66 prevents an undesirable negative charge from accumulating on the surface of the wafer.

The inner graphite liner is provided with serrations 126. The serrations 126 are formed by alternating adjacent wafer-facing surfaces 128 and target-facing surfaces 130, which face in first and second directions, respectively.

Photoresist or other material which may sputter back from the wafer W or the disk 40 during operation of the implantation system collects on the wafer-facing surfaces 128. Over time, the wafer-facing surfaces become electrically non-conductive. The target-facing surfaces remain clean and therefore conductive. The conductive target-facing surfaces provide a shunt (low resistance) path to ground for high energy electrons generated in the electron shower. As used herein, the terms "serrated" and "serrations" are used to broadly describe a surface having both wafer-facing surfaces and target-facing surfaces, e.g., a notched, undulating, or stepped surface.

In addition to the serrations 126, because the tube is connected to the target 64, it is also biased to −6 V by the zener diode 79. Biasing the extension tube 66 at a low negative potential prevents low energy secondary electrons generated by the electron shower from being shunted away from the wafer and keeps them available for wafer charge neutralization, even when the electron shower is first used. The biased tube therefore does not require a period of time before operation stabilizes, as would be required if the tube were not biased.

The present invention also provides a plasma-enhanced electron shower which is easily refurbished over the course of its useable lifetime. The target 64 and the extension tube 66 of the target/tube assembly 62 are both provided with inner graphite liners, 82 and 88, respectively, which may are easily replaced during maintenance operations. With reference to FIG. 3, extension tube 66 may be detached from target 64 by removing bolts 98 and collars 99. Filament assembly 67 may be removed from its position within the cutout 78 of target 64. With the extension tube and filament assembly removed, the inner liner 82 may be slid out of the aluminum housing 80 in the direction of exit aperture 92. A new liner may then be installed into the aluminum housing 80.

Also, with the extension tube 66 detached from the target 64, by removing screws 89, the inner liner 89 may be slid out of the aluminum housing 86 in the direction of the entrance aperture 94. A new inner liner 89 may then be installed into the aluminum housing 86 and secured into position with screws 89. The re-lined extension tube 66 may then be reattached to the re-lined target 64, by means of bolts 98 and collars 99, to complete the target/tube assembly refurbishment process.

Accordingly, a preferred embodiment of an improved ion implanter electron shower for enhanced generation of secondary electrons has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

We claim:

1. An extension tube (66) for an electron shower (62) in an ion implantation system (10), said extension tube comprising an outer surface (86) and an inner surface (88), said inner surface being electrically biased and having a first set of surfaces (128) which substantially face in a first direction and a second set of surfaces (130) which face substantially in a second direction.

2. The extension tube (66) of claim 1, wherein said inner surface (88) is serrated.

3. The extension tube (66) of claim 1, wherein said inner surface is biased to about −6 V.

4. The extension tube (66) of claim 1, wherein said inner surface (88) is composed of graphite.

5. The extension tube (66) of claim 4, wherein said outer surface (86) is comprised of aluminum.

6. The extension tube (66) of claim 4, wherein said graphite inner surface comprises a replaceable inner graphite liner.

7. The extension tube (66) of claim 6, wherein said replaceable inner graphite liner (88) is secured to said outer surface (86) by means of fasteners (89).

8. An electron shower (62) for an ion implantation system (10), comprising:
  (I) a target (64) providing a chamber (84) having an entrance aperture (90) and an exit aperture (92) through which an ion beam may pass from upstream of said target to downstream of said target toward a wafer to be implanted; and
  (ii) an extension tube (66) connected to said target (64), said extension tube comprising an outer surface (86) and an inner surface (88), said inner surface being electrically biased and having alternating wafer-facing surfaces (128) and target-facing surfaces (130).

9. The electron shower (62) of claim 8, wherein said inner surface (88) is serrated.

10. The electron shower (62) of claim 8, wherein said inner surface is biased to about −6 V.

11. The electron shower (62) of claim 8, wherein said inner surface (88) is composed of graphite.

12. The electron shower (62) of claim 11, wherein said outer surface (86) is comprised of aluminum.

13. The electron shower (62) of claim 11, wherein said graphite inner surface comprises a replaceable inner graphite liner.

14. The electron shower (62) of claim 13, wherein said replaceable inner graphite liner (88) is secured to said outer surface (86) by means of fasteners (89).

15. A method of refurbishing an extension tube (66) in a target/tube assembly (62) of an ion implanter electron shower, the assembly comprising a target (64) and the extension tube (66) attached thereto, the extension tube (66) having an interior at least partially defined by a replaceable inner liner (88), said method comprising the steps of:

(I) detaching the target (64) from the extension tube (66) to expose the inner liner (88);

(ii) removing the inner liner from said extension tube;

(iii) installing a replacement inner liner in said extension tube; and (iv) re-attaching the target (64) to the extension tube (66) having the replacement inner liner installed therein.

16. The method of claim 15, wherein the inner liner and the replacement inner liner are comprised of graphite.

17. The method of claim 16, wherein said steps of removing and installing the extension tube inner liner comprise the steps of loosening and tightening fasteners (89), respectively, which secure the inner liner to the extension tube.

* * * * *